United States Patent
Yamazaki et al.

(10) Patent No.: US 6,646,284 B2
(45) Date of Patent: Nov. 11, 2003

(54) LIGHT EMITTING DEVICE AND METHOD OF MANUFACTURING THE SAME

(75) Inventors: Shunpei Yamazaki, Tokyo (JP); Mayumi Mizukami, Kanagawa (JP); Yasuyuki Arai, Kanagawa (JP)

(73) Assignee: Semiconductor Energy Laboratory Co., Ltd.

( * ) Notice: Subject to any disclaimer, the term of this patent is extended or adjusted under 35 U.S.C. 154(b) by 0 days.

(21) Appl. No.: 10/012,369

(22) Filed: Dec. 12, 2001

(65) Prior Publication Data

US 2002/0084464 A1 Jul. 4, 2002

(51) Int. Cl.⁷ .......................... H01L 51/00; G02F 1/136
(52) U.S. Cl. .......................... 257/40; 257/59; 257/642; 257/759; 349/43; 349/69
(58) Field of Search .................. 257/40, 642, 759, 257/918, 656, 69, 59, 13, 79–103; 438/82, 99, 623, 725, 780; 349/42, 43, 69; 313/500–506

(56) References Cited

U.S. PATENT DOCUMENTS

| | | | |
|---|---|---|---|
| 5,917,280 A | * 6/1999 | Burrows et al. | 313/506 |
| 6,037,712 A | 3/2000 | Codama et al. | |
| 6,160,828 A | * 12/2000 | Kozlov et al. | 372/39 |
| 6,232,714 B1 | * 5/2001 | Shen et al. | 313/506 |
| 6,297,516 B1 | * 10/2001 | Forrest et al. | 257/40 |
| 6,351,066 B1 | 2/2002 | Gyoutoku et al. | |
| 6,429,584 B2 | 8/2002 | Kubota | |
| 2001/0023661 A1 | 9/2001 | Hiroki et al. | |
| 2001/0049030 A1 | * 12/2001 | Okada et al. | 428/690 |

OTHER PUBLICATIONS

Tsutsui et al.; "Electroluminescence in Organic Thin Films"; *Photochemical Processes in Organized Molecular Systems*, pp. 437–450; 1991.

M.A. Baldo et al.; "Highly Efficient Phosphorescent Emission from Organic Electroluminescent Devices" *Nature*, vol. 395; pp. 151–154; Sep. 10, 1998.

M.A. Baldo et al.; "Very High-Efficiency Green Organic Light-Emitting Devices Based on Electrophosphorescence"; *Applied Physics Letters*, vol. 75, No. 1; pp. 4–6; Jul. 5, 1999.

Tsutsui et al.; "High Quantum efficiency in Organic Light-Emitting Devices with Iridium-Comolex as a Triplet Emissive Center"; *Japanese Journal of Applied Physics*, vol. 38, Part 12B; pp. L1502–L1504; Dec. 15, 1999.

* cited by examiner

Primary Examiner—David Nelms
Assistant Examiner—Long Tran
(74) Attorney, Agent, or Firm—Fish & Richardson P.C.

(57) ABSTRACT

Two aspects, an impurity factor and a structural factor are assumed as the deterioration causes of an organic light emitting device and means for solving the respective factors are provided. In order to prevent deterioration of the light emitting device, concentrations of moisture and oxygen, which are left in a space in which an organic light emitting element is sealed, are minimized. At the same time, an impurity including oxygen, such as moisture or oxygen which is included in an organic compound composing the organic light emitting element, is reduced. An element structure for preventing the deterioration of the organic light emitting element due to stress is used to suppress the deterioration.

17 Claims, 10 Drawing Sheets

LIGHT EMITTING DEVICE AND METHOD OF MANUFACTURING THE SAME

BACKGROUND OF THE INVENTION

1. Field of the Invention

The present invention relates to a light emitting device using a phosphor or a light emitting element and a method of manufacturing the same. More particularly, the present invention relates to a light emitting device manufactured using an organic compound for a phosphor or a light emitting element and a method of manufacturing the same. Note that light emission in this specification includes fluorescence and phosphorescence and that the present invention includes light emission by any one of them or both.

2. Description of the Related Art

In a typical display device using liquid crystal, a back light is used and it is constructed such that an image is displayed by the back light. Although a liquid crystal display device is used as an image display means in various electronic devices, it has a structural defect such as a narrow view angle. On the other hand, since a display device using a phosphor for a pixel portion has a wide view angle and superior visibility, it is noted as a next generation display device.

A light emitting element using an organic compound for a phosphor (hereinafter referred to as an organic light emitting element) has a structure such as an appropriate combination of a hole injection layer, a hole transport layer, a light emitting layer, an electron transport layer, an electron injection layer, and the like, which are made of the organic compound, is provided between an anode and a cathode. Here, although the hole injection layer and the hole transport layer are separately indicated, these are identical in a sense that hole transportability (hole mobility) is a particularly important characteristic. For convenience, the hole injection layer is a layer in the side which is in contact with the anode. A layer in the side which is in contact with the light emitting layer is separately called the hole transport layer. A layer which is in contact with the cathode is called the electron injection layer and a layer in the side which is in contact with the light emitting layer is called the electron transport layer. There is a case where the light emitting layer also serves as the electron transport layer and thus it is called a light emitting electron transport layer. A light emitting element composed of a combination of these layers indicates a rectifying characteristic and thus it is considered that such light emitting element is one of diodes. In this specification, these are generically called an organic compound layer.

Both a small molecular system organic compound and a polymer system organic compound are known as organic compounds for forming the organic light emitting element. With respect to an example of the small molecular system organic compound, 4,4'-bis[N-(naphthyl)-N-phenyl-amino]-biphenyl (hereinafter referred to as "α-NPD") and 4,4',4"-tris(N-3-methylphenyl-N-phenyl-amino)triphenylamine (hereinafter referred to as "MTDATA") as copper phthalocyanine (CuPc) aromatic amine system materials are known for the hole injection layer and tris-8-quinolinolato aluminum complex (Alq$_3$) and the like are known for the light emitting layer. With respect to the polymer system organic compound, polyaniline, polyethylenedioxythiophene (PEDOT) as a polythiophene derivative, and the like are known.

In view of the variety of material, it is said that the small molecular system organic compound produced by an evaporation method has remarkable variety as compared with the polymer system organic compound. However, in any case, an organic compound purely made of only a base constitutional unit is rare. Thus, as a result of different kinds, there is the case where an impurity is mixed during a manufacturing process or various additives such as pigments are added. Also, these materials include a material deteriorated by moisture and a material which is easy to oxidize. Since mixing of moisture, oxygen, and the like from an atmosphere is easily allowed, it requires careful handling.

The light emitting mechanism is considered as a phenomenon such that an electron injected from a cathode and a hole injected from an anode are recombined in a light emitting layer made from a phosphor to form a molecular exciton and the molecular exciton emits light when it is returned to a ground state. As an excitation state, there are light emitting (fluorescence) from a singlet excitation state and light emission (phosphorescence) from a triplet excitation state. Since the intensity reaches several thousands to several tens of thousands of cd/m$^2$, it is considered that this light emission mechanism can be applied, in principle, to a display device and the like.

On the other hand, there are various deterioration phenomena with respect to the organic light emitting element and thus these are regarded as problems. In particular, when the organic light emitting element is driven for a long time, there is a deterioration phenomenon such that a light emitting intensity decreases with the passage of time. Although this deterioration phenomenon is dependent on a drive condition such as a voltage applied to the organic light emitting device, the time when the light emitting intensity reaches a half of an initial value (a half life) is about 500 to 5000 hours. Thus, this becomes a large hindrance to practical use.

As one of reasons for deterioration of the organic light emitting element, it is known that the deterioration is progressed by only exposing it to air. One of reasons of such deterioration is considered that an alkali metal material composing a cathode reacts with moisture or oxygen. Thus, the organic light emitting element is sealed in a closed space and further the closed space is filled with a drying agent to take a measure for minimizing the deterioration.

However, even if such a sealing structure is used, the deterioration of the organic light emitting element cannot be completely prevented under the current state. In view of such a condition, it can be expected that the deterioration of the organic light emitting element is progressed even with a trace of moisture or oxygen present. Also, it can be considered that some factor other than such a factor is present.

With respect to an oxygen molecular, a highest occupied level of a molecular orbit (HOMO) is degenerated, and thus it is a specific molecular having a triplet state in a ground level. Generally, an excitation process from a triplet to a singlet is a forbidden transition (spin forbidden transition) and thus is hard to produce. Therefore, the oxygen molecular having the singlet state is not generated. However, if a molecular having the triplet excitation state ($^3$M*) which is a higher energy state than the singlet state is present around the oxygen molecular, the following energy transfer is produced and thus a reaction whereby the oxygen molecular having the singlet state is generated can be induced.

$$^3M^* + {}^3O_2 \rightarrow M + {}^1O_2 \qquad \text{Formula 1}$$

It is said that 75% of excitation states of molecular in the light emitting layer of the organic light emitting element are the triplet state. Therefore, when the oxygen molecular is mixed into the organic light emitting element, generation of the oxygen molecular having a singlet state is allowed by the energy transfer as indicated in the reaction formula (1). Since the oxygen molecular having the single excitation state has an ionic (charges are unbalanced) characteristic, a possibility that the molecular reacts to the unbalance of charges generated in the organic compound is considered.

For example, with respect to bathocuproine (hereinafter referred to as "BCP"), since a methyl group has an electron donating characteristic, carbon directly bonded to a conjugated ring is positively charged. As indicated by the following structural formula (I), when a positively charged carbon molecular is present, there is a possibility that singlet oxygen having an ionic characteristic reacts to it and carboxylic acid and hydrogen can be produced as indicated by the following structural formula (II). As a result, it is expected that an electron transport characteristic is deteriorated.

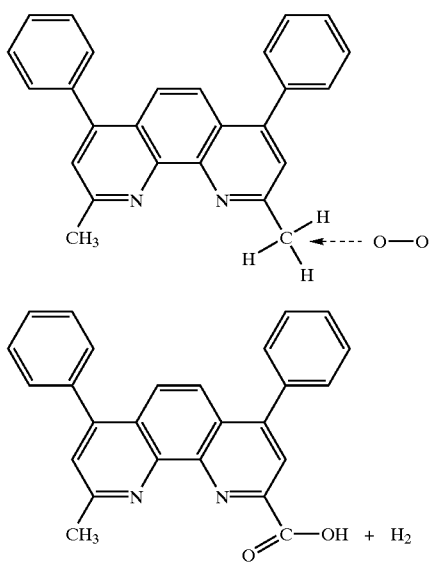

Chem. 1

Chem. 2

Of course, such a change in a bonding state is one example of consideration in which the phenomenon is simplified. However, it can be explained that impurities such as oxygen and moisture, which are included in the organic compound, cause various deterioration phenomena such as intensity reduction.

An application example using the organic light emitting element is an active matrix drive light emitting device in which a pixel portion is composed of the organic light emitting element. The active matrix drive light emitting device in which the pixel portion is composed of a combination of the organic light emitting element and a thin film transistor (hereinafter referred to as "a TFT") is completed by suitably combining a semiconductor material containing mainly silicon, an inorganic insulating material containing silicon, and an organic insulating material represented by polyimide, acrylic, or the like. Since an external quantum efficiency of the organic light emitting element still does not reach 50%, a large number of injected carriers are converted into heat and thus the light emitting element generates is heated. As a result, thermal stress is applied to the pixel portion and acts on respective layers composing the pixel portion. If the stress is large, a crack is caused.

With respect to the light emitting device using the organic light emitting element composed of a combination of an insulator, a semiconductor, a conductor, an organic compound, and the like, the interaction between internal stresses in respective films and thermal stress produced by heating cannot be neglected.

SUMMARY OF THE INVENTION

The present invention is a technique for solving such problems, and it is an object of the invention to provide measures for solving the respective factors by considering two aspects, such as an impurity factor and a structural factor, as causing the deterioration of the organic light emitting device. In addition, it is an object of the present invention to provide a light emitting device in which the deterioration of the organic light emitting element is suppressed and which has high reliability.

According to the present invention, in order to prevent the deterioration of the light emitting device, concentrations of moisture and oxygen, which are left in a space in which the organic light emitting element is sealed, are minimized. Simultaneously, an impurity including oxygen, such as moisture and oxygen included in the organic compound composing the organic light emitting element, is reduced. Further, an element structure for preventing the deterioration of the organic light emitting element due to the stress is used to suppress the deterioration.

FIGS. 1A to 1C are flowcharts for explaining a method of manufacturing a light emitting device of the present invention. FIG. 1A shows a typical example thereof. A first conductive film is formed on an insulating film and a first electrode is formed as one electrode of the organic light emitting element. After that, the insulating film is etched to form a contact hole. This contact hole is provided so as to electrically connect one electrode of the organic light emitting element with an active element in the case of the active matrix drive. Thus, when a passive matrix drive light emitting device is manufactured, this contact hole is not formed.

Then, a second conductive film is formed and a second electrode which is in contact with the first electrode is formed. In the case of the active matrix drive light emitting device, a first wiring and a second wiring are formed using the second conductive film.

An insulating film is formed on or over the second electrode, the first wiring, and the second wiring so as to locate the end portions in the outside of them. This is not limited to the insulating film and a conductive film or a semiconductor film may be used. This insulating film is located on or over the second electrode, the first wiring, and the second wiring and forms a so-called canopy. Then, this is utilized as a mask when an organic compound layer and a third electrode are provided in a later process.

An evaporation method is used as a typical method of forming the organic compound layer. In an evaporation apparatus for forming an organic compound layer, a wall surface in the interior of a reaction chamber is mirror-finished by electropolishing to decrease the amount of gases emitted. Stainless steel or aluminum is used as a material of the reaction chamber. For the purpose of preventing gas emission from the inner wall, a heater is provided outside the reaction chamber to perform baking processing. Although the amount of gases emitted can be greatly decreased by the baking processing, it is preferably cooled using refrigerant at the time of evaporation. A turbo molecular pump and a dry pump are used as an evacuation system to prevent a contamination due to an oil steam. In order to remove residual moisture, a cryopump may be provided together with these pumps.

Although an evaporation source is basically of a resistance heating type, a Knudsen cell may be used. An evaporation material is loaded from a load lock type exchange chamber which is added to the reaction chamber. Thus, a possibility of exposing the reaction chamber to an atmosphere at the time of loading the evaporation material is minimized. Although the evaporation material is mainly an organic material, purification by sublimation is performed within the reaction chamber before evaporation. As another method, zone purification may be applied.

The structure of the organic compound layer is not particularly limited. It is obtained by suitably combining the hole injection layer, the hole transport layer, the light emitting layer, the electron transport layer, and the like. Further, the third electrode is similarly formed by an evaporation method. After the formation of the organic compound layer, thermal treatment for emitting moisture and the like which are mixed during the evaporation may be performed at a pressure of $1 \times 10^{-4}$ Pa or less.

The first electrode and the third electrode are formed as the anode and the cathode, respectively, using applied materials. Thus, the organic light emitting element can be manufactured. Alternatively, the first electrode and the third electrode can be formed as the cathode and the anode, respectively. A transparent conductive material is used as a material for forming the anode and an indium tin compound, a zinc oxide, or the like can be used. A material including magnesium (Mg), lithium (Li), or calcium (Ca), which has a small work function, is used as a material for the cathode. An electrode made of MgAg (material obtained by mixing Mg and Ag at a ratio of Mg:Ag=10:1) is preferably used. In addition, there are an ytterbium (Yb) electrode, an MgAgAl electrode, an LiAl electrode, and an LiFAl electrode as the example thereof.

After that, a seal pattern is formed using an ultraviolet curable resin or the like to perform bonding of a sealing plate. Thus, the organic light emitting element is held in a closed space. Such a sealing process is performed in an atmosphere of an inert gas such as high purity dry nitrogen, helium, argon, krypton, or neon. As a result, the closed space is filled with the gas and thus the concentrations of moisture, oxygen, and the like in this space can be sufficiently decreased.

However, even if such a treatment is performed, moisture and oxygen in the closed space cannot be completely removed. For example, there is a possibility that the concentrations of moisture and oxygen in the closed space even after sealing are increased due to degassing from the organic compound layer, its surroundings, and a wall surface of a sealing member. As a result, even if complete sealing is performed, the deterioration of the organic light emitting element cannot be prevented.

Therefore, in the present invention, after sealing, a temperature cycle of heating and cooling is performed to promote degassing, and processing such that the gas is absorbed in the drying agent provided in the closed space is performed. The heating is performed to promote degassing. Barium oxide (BaO) is used as the drying agent. Since a reaction of BaO and moisture is an exothermic reaction as indicated in the following reaction formula (2), the reaction is further promoted by decreasing temperature to perform cooling. Thus, a temperature cycle of heating and cooling, or cooling and heating is repeated to further decrease the concentrations of moisture and oxygen in the closed space.

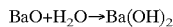  Formula 2

After that, a power supply test is performed for aging the organic light emitting element. This power supply test has two purposes. One purpose is to stabilize the organic light emitting element and to detect an initial failure. The other purpose is to perform degassing processing. In the case where the organic light emitting element emits light at an intensity of 1000 cd/cm$^2$, when this is converted into a photon, it corresponds to the amount of emission of $10^{16}$/second cm$^2$. When it is assumed that a quantum efficiency of the organic light emitting element is 1%, a necessary current density is 100 mA/cm$^2$. Joule heat is produced by a current flowing at this time and thus the organic light emitting element generates heat. By this heat generation, there is a case where impurities included in the organic compound layer, in particular, moisture and the like, are emitted. In order to effectively absorb moisture in the drying agent, the temperature cycle may be repeated again.

FIG. 2 is a diagram explaining the progression of a temperature change in the organic light emitting element obtained by such a manufacturing method. The organic light emitting element is formed at a room temperature (temperature increase due to evaporation is neglected here). After that, thermal treatment is performed at a temperature such that the organic compound layer is not deteriorated to perform dehydration processing or deoxygenation processing. Third electrode formation, seal pattern formation, sealing plate bonding are also performed at a room temperature. After that, the temperature cycle of heating and cooling is performed. With respect to a heating temperature, a temperature such that the organic compound layer is not deteriorated is also set as a maximum temperature. However, the entire element including the sealing plate is heated for dehydration processing. Therefore, it is desirable that the heating temperature is 60° C. or higher, preferably, 80° C. or higher. Cooling is performed to promote the reaction of BaO and cooling at 0° C. or lower, preferably at a temperature lower than −100° C. is desirable. The order of heating and cooling may be changed and desirably repeated plural times. Thus, a dew point in the close space is set to be −50° C. or lower, preferably, −80° C. or lower. Also in this case, one purpose of the power supply test is to heat the organic light emitting element during light emission to positively perform dehydration processing.

The reliability of the light emitting device using the organic light emitting element can be improved by such processing. Also, as shown in FIG. 1B, processes from insulating film formation to third electrode formation are performed as in the above case and then a diamond like carbon (DLC) film having high gas barrier characteristic may be formed to cover the organic light emitting element. The DLC film has SP$^3$ bonding as bonding between carbons in a short range order but becomes an amorphous structure in macro. With respect to the composition of the DLC film, carbon is 95 to 70 atoms % and hydrogen is 0.1 to 30 atoms % and thus the DLC film is very hard and has a superior insulation characteristic. Such a DLC film has a characteristic such that permeability of gases such as steam and oxygen is low. Also, it is known that the DLC film has a hardness of 15 to 25 GPa from measurement by a microhardness meter. As a result, entering of moisture from the outside is blocked and the deterioration can be prevented. Thus, the temperature cycle processing after that is not particularly performed.

With respect to processes as shown in FIG. 1C, processes from insulating film formation to sealing plate bonding are performed in the same manner as in the case of FIG. 1A. However, thermal treatment is not performed during these processes. After that, the temperature cycle processing and the power supply test are performed. The processes indicated here are one example and the present invention is not limited to only the processes indicated here. The present invention is characterized in that the dew point of gas in the sealed closed space is decreased by the thermal processing for the organic compound layer or the temperature cycle processing for the organic light emitting device, whereby the reliability of the organic light emitting device is improved.

According to a structure of the present invention, there is provided a light emitting device comprising: a first electrode located on a first insulating film; a second electrode which is in contact with the first electrode; a second insulating film formed on the second electrode; an organic compound layer located on the first electrode; and a third electrode located on the organic compound layer, in which end portions of the second insulating film are provided outside end portions of the second electrode and are formed at positions not overlapping with end portions of the organic compound layer.

Further, according to another structure of the present invention, there is provided a light emitting device comprising: a first electrode located on a first insulating film; a second electrode which is in contact with end portions of the first electrode; a second insulating film which is provided on the second electrode and its end portions are located outside the second electrode; an organic compound layer located on the first electrode; and a third electrode located on the organic compound layer, in which end portions of the organic compound layer are formed at positions not overlapping with end portions of the second insulating film.

Further, according to another structure of the present invention, there is provided a light emitting device comprising: a first electrode provided between a first wiring and a second wiring; a second electrode connected with the first electrode; an organic compound layer located on the first electrode; and a third electrode located on the organic compound layer, in which the organic compound layer and the third electrode are provided inside the first wiring and the second wiring.

Further, according to another structure of the present invention, there is provided a light emitting device comprising: a first wiring formed on a first insulating film; a second insulating film provided on the first wiring; a second wiring; a third insulating film provided on the second wiring; a first electrode provided between the first wiring and the second wiring; a second electrode connected with the first wiring; an organic compound layer located on the first electrode; and a third electrode located on the organic compound layer, in which end portions of the second insulating film are provided outside the first wiring, end portions of the third insulating film are provided outside the second wiring, and the organic compound layer and the third electrode are provided inside the first wiring and the second wiring.

Further, according to another structure of the present invention, there is provided a light emitting device comprising; a first organic compound layer provided on the first electrode; a second electrode provided on the first organic compound layer; a third electrode provided between the second wiring and a third wiring; a second organic compound layer provided on the third electrode; and a fourth electrode provided on the second organic compound layer, in which the second electrode is connected with the fourth electrode in an outer edge portion of the pixel portion.

Further, according to anther structure of the present invention, there is provided a light emitting device in which a pixel portion is formed on a first insulating film, comprising: a first electrode provided between a first wiring and a second wiring; a first organic compound layer provided on the first electrode; a second electrode provided on the first organic compound layer; a first insulating film and a second insulating film which are provided on the first wiring and the second wiring, respectively, such that end portions of the first insulating film and the second insulating film extend beyond side portions of the first wiring and the second wiring; a third electrode provided between the second wiring and a third wiring; a second organic compound layer provided on the third electrode; a fourth electrode provided on the second organic compound layer; and a third insulating film and a fourth insulating film which are provided on the third wiring and a fourth wiring, respectively, such that end portions of the third insulating film and the fourth insulating film extend beyond side portions of the third wiring and the fourth wiring, in which the first organic compound layer is provided so as not to overlap with the end portions of the first insulating film and the second insulating film and the second electrode is connected with the fourth electrode in an outer edge portion of the pixel portion.

According to anther structures of the present invention, there is provided a light emitting device in which a pixel portion is formed on a first insulating film, the pixel portion including: a first electrode provided between a first wiring and a second wiring; a first organic compound layer provided on the first electrode; a second electrode provided on the first organic compound layer; a third electrode provided between the second wiring and a third wiring; a second organic compound layer provided on the third electrode; and a fourth electrode provided on the second organic compound layer, in which the pixel portion is provided in a closed space produced by a sealing member and a concentration of oxygen and moisture in the closed space is 2 ppm or lower.

According to anther structure of the present invention, there is provided a light emitting device in which a pixel portion is formed on a first insulating film, the pixel portion including: a first electrode provided between a first wiring and a second wiring; a first organic compound layer provided on the first electrode; a second electrode provided on the first organic compound layer; a third electrode provided between the second wiring and a third wiring; a second organic compound layer provided on the third electrode; and a fourth electrode provided on the second organic compound layer, in which the pixel portion is provided in a closed space produced by a sealing member, the closed space is filled with at least one gas selected from the group consisting of nitrogen, helium, argon, krypton, and neon, and a concentration of oxygen and moisture in the closed space is 2 ppm or lower.

According to a pixel structure using such an organic light emitting element, since the organic compound layer is formed on the first electrode and is not in contact with other members on the first electrode, the organic compound layer is never affected by imposed stress. Thus, the organic light emitting element is prevented from being deteriorated by thermal stress due to a temperature change in surroundings or self-heating.

As described above, according to the present invention, two aspects, an impurity factor and a structural factor, are considered as the causes of deterioration of the organic light emitting device and means for solving the respective factors are provided. Hereinafter, the present invention will be described in further details through the embodiments.

DETAILED DESCRIPTION OF THE PREFERRED EMBODIMENTS

Figure 1:
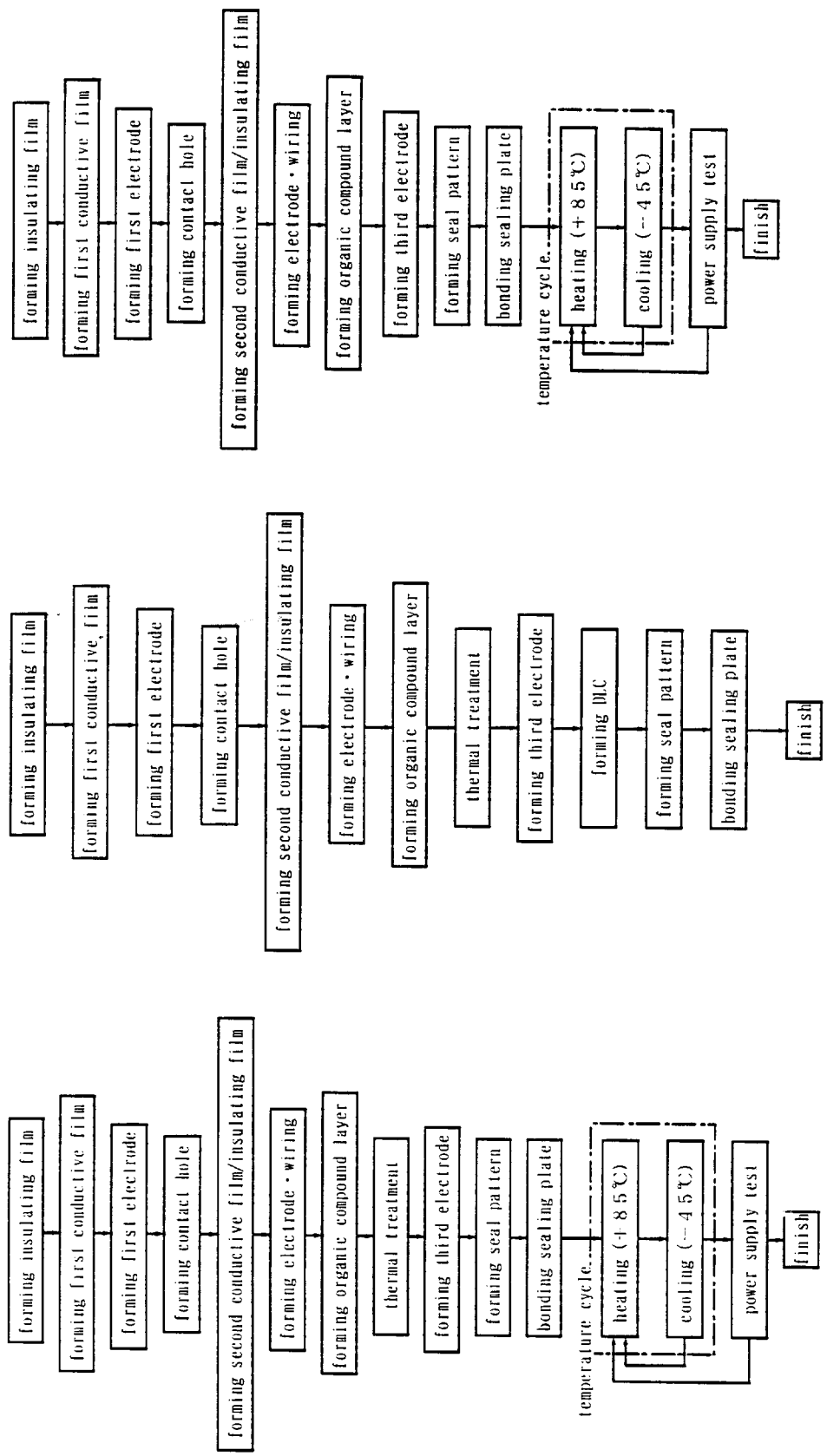
FIGS. 1A to 1C are flow charts for explaining methods of manufacturing a light emitting device of the present invention.
Figure 2:
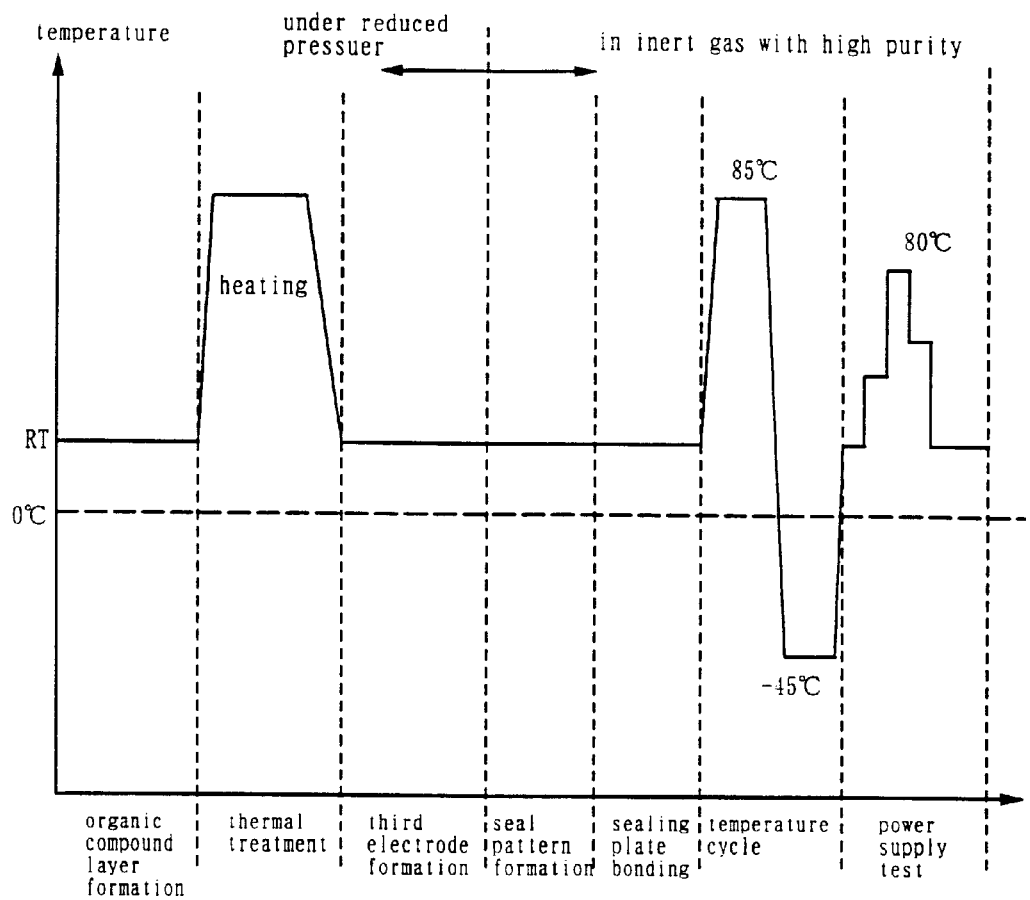
FIG. 2 is a graph for explaining a temperature change in the method of manufacturing the light emitting device of the present invention.
Figure 3:
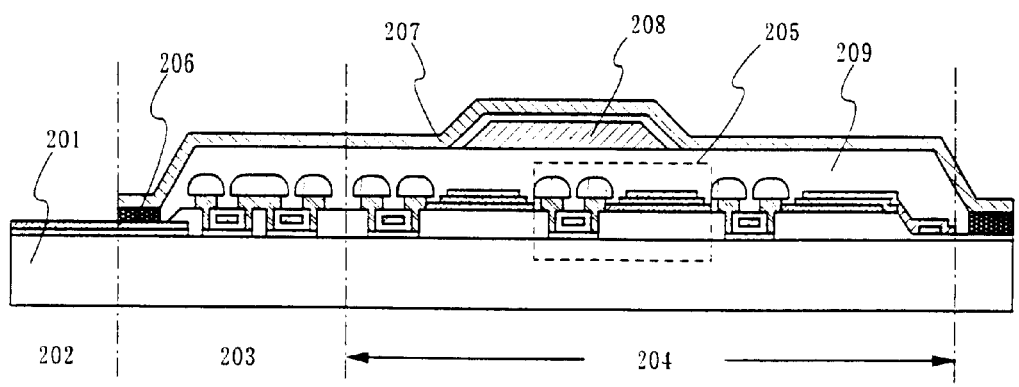
FIG. 3 is a cross sectional view for explaining a structure of the light emitting device of the present invention.

FIG. 3 shows a structure of a light emitting device of the present invention. A substrate 201 has an insulating surface. A pixel portion 204 in which an organic light emitting element is formed, a driver circuit portion 203 for driving TFTs in the pixel portion 204, and a terminal portion 202 for inputting a signal from an external circuit, are provided in the substrate 201. The pixel portion 204 and the driver circuit portion 203 are formed in a closed space 209 covered with a sealing plate 207. The sealing plate 207 is adhered to the substrate 201 through a seal member 206. The closed space 209 is filled with one kind of gas or plural kinds of gases, selected from the group consisting of nitrogen, helium, argon, krypton, and neon. A dew point of the gas is set to be −50° C. or lower, preferably −80° C. or lower. A dry agent 208 is provided in the closed space 209. Moisture in the space is chemically absorbed and thus the dew point of the gas which fills the space is decreased as described above. Of course, in order to decrease the dew point, it is necessary to perform the manufacturing processes described using FIGS. 1A to 1C and FIG. 2 and the dehydration processing and the reaction promotion of BaO by the temperature cycle processing are required.

The light emitting device shown in FIG. 3 is an active matrix drive device manufactured using TFTs. A pixel 205 in the pixel portion 204 has an organic light emitting element and a TFT connected therewith. The organic light emitting element is provided on an insulating layer formed in the upper layer of the gate electrode of the TFT.

The organic light emitting element includes a first electrode formed on an insulating surface, an organic compound layer, and a second electrode. It is desirable that processes from the formation of the organic compound layer to bonding of a sealing plate are performed in a closed space (or in a processing chamber) in succession without exposing it to an atmosphere.

Figure 4:
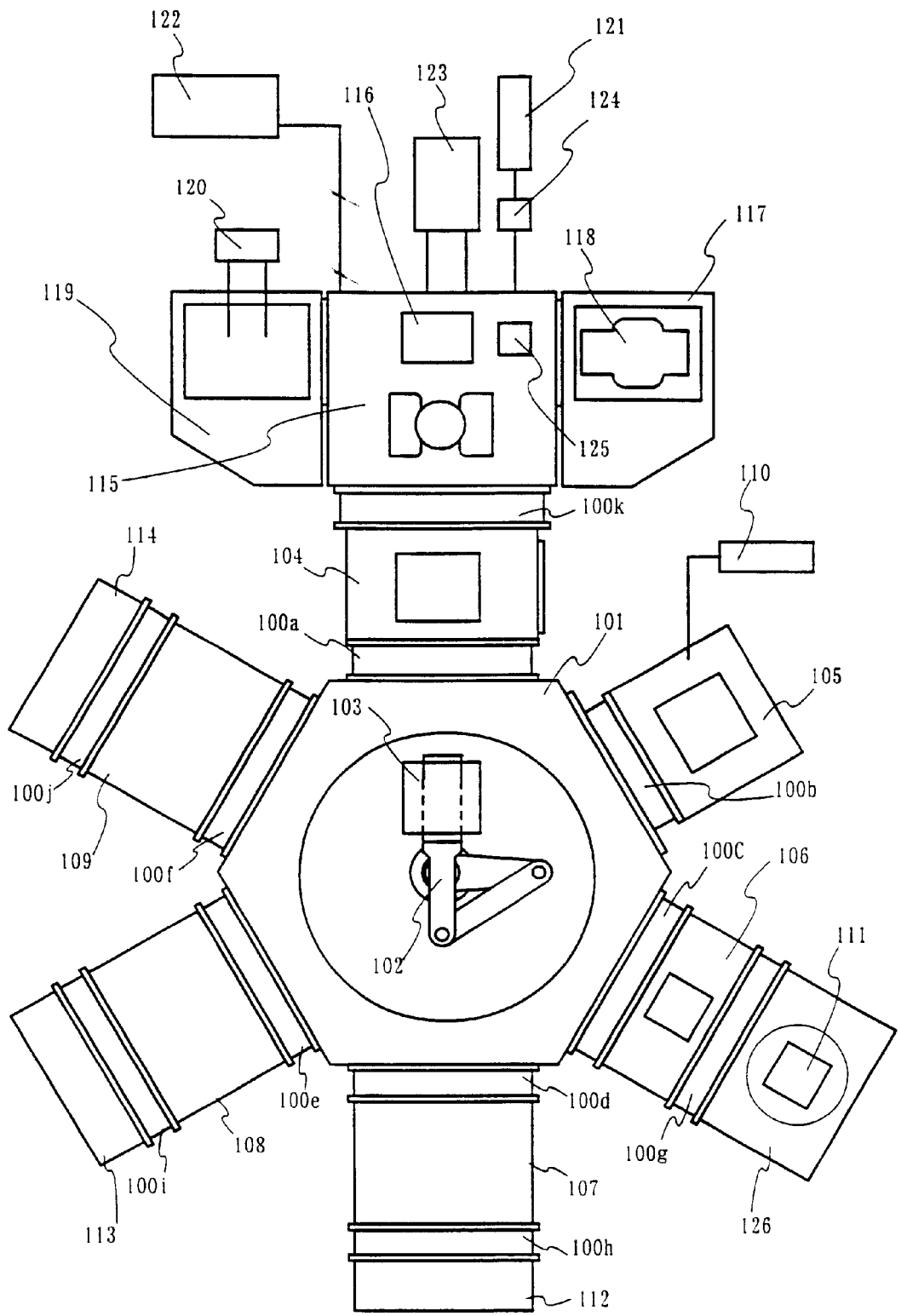
FIG. 4 is a top surface view for explaining the structure of the light emitting device of the present invention.

FIG. 4 shows one example of a manufacturing apparatus for achieving the purpose. A transfer chamber 101 is connected with a load chamber 104, a thermal treatment chamber 105, an intermediate chamber 106, and film formation chambers 107 to 109 through gates 100a to 100f. The thermal treatment chamber 105 is used to perform the temperature cycle processing described using FIGS. 1A to 1C and FIG. 2. A heating and cooling means 110 is provided in the thermal treatment chamber 105 and thus processing in a vacuum and in an inert gas is allowed.

The film formation chambers 107 and 108 are processing chambers for forming coatings made of mainly a small molecular organic compound by an evaporation method, and the film formation chamber 109 is a processing chamber for forming a third electrode including alkali metal by an evaporation method. The film formation chambers 107 to 109 are connected with material exchange chambers 112 to 114 for loading evaporation materials to evaporation sources through gates 100h to 100j. The material exchange chambers 112 to 114 are used to load the evaporation materials to the evaporation sources without exposing the film formation chambers 107 to 109 to an atmosphere.

First, a substrate 103 on which coatings are deposited is set in the load chamber 104 and moved to the respective processing chambers by a transfer means 102 located in the transfer chamber 101. The load chamber 104, the transfer chamber 101, the thermal treatment chamber 105, the intermediate chamber 106, the film formation chambers 107 to 109, and the material exchange chambers 112 to 114 are kept to be a reduced pressure state by an evacuation means. The evacuation means performs vacuum evacuation from the atmospheric pressure to about 1 Pa by an oil free dry pump and performs vacuum evacuation to a pressure of 1 Pa or higher by a magnetic levitation turbo molecular pump or a composite molecular pump. A cryopump may be added to the reaction chamber in order to remove moisture. Thus, the contamination of an organic matter such as mainly oil is prevented from the evacuation means side.

Inner wall surfaces of these chambers to be vacuum-evacuated are mirror-finished by electropolishing. Thus, a surface area is decreased to prevent gas emission. As its material, stainless steel or aluminum is used. For the purpose of suppressing gas emission from inner walls, it is desirable that a heater is provided outside the reaction chamber and baking processing is performed. The gas emission can be greatly suppressed by the baking processing. In order to further prevent the impurity contamination due to the gas emission, it is preferably cooled using refrigerant at the time of evaporation. Therefore, a degree of vacuum up to $1 \times 10^{-6}$ Pa is realized.

The intermediate chamber 106 is connected with an application chamber 126 including a spinner 111 through gate 100g. The application chamber 126 is a processing chamber for forming a coating of an organic compound made of mainly a polymer material by a spin coat method. This processing is performed at the atmospheric pressure. Thus, loading and unloading of the substrate are performed through the intermediate chamber 106 by controlling a pressure of the intermediate chamber 106 to the same pressure as the chamber to which the substrate is moved. The polymer system organic material supplied to the application chamber is purified by a dialysis method, an electrodialysis method, or a high speed liquid chromatograph. The purification is performed at a supply inlet.

The small molecular organic compound layer is formed by an evaporation method. Although the evaporation method is of a resistance heating type, a Knudsen cell may be used to control a temperature and the amount of evaporation with high precision. An evaporation material is introduced from a dedicated exchange chamber which is added to the reaction chamber. Thus, a possibility of exposing the reaction chamber to an atmosphere is minimized. When the film formation chamber is exposed to an atmosphere, moisture and various gases are absorbed on the inner wall thereof. Then, vacuum evacuation is performed and thus moisture and gases are again emitted. As regards the time required from stopping of emission of absorption gases to stability of the degree of vacuum to an equilibrium value, it takes several tens to several hundreds of hours. Thus, baking processing is performed for the wall of the film formation chamber to shorten this period. However, repetition of atmosphere exposure is not an effective method. Therefore, a dedicated material exchange chamber is desirably provided as shown in FIG. 4. Although the evaporation material is mainly an organic material, purification by sublimation is performed in the interior of the reaction chamber before evaporation. A zone purification method may be applied.

When thermal treatment is performed after the formation of the organic compound layer, the substrate is moved to the thermal treatment chamber 105. When a conductive layer including alkali metal as a third electrode is formed, the substrate is moved to the film formation chamber 109.

On the other hand, a sealing chamber separated by the load chamber 104 is used to perform processing for sealing the substrate after the formation of the cathode is completed with a sealing plate without exposing it to an atmosphere. The sealing chamber 115 is kept at a reduced pressure of $1 \times 10^{-4}$ Pa or lower by an evacuation means 122. After the substrate is loaded, the sealing chamber 115 is filled with an inert gas by a gas supply means 121 until it reaches the atmospheric pressure. As the evacuation means, a turbo molecular pump, a cryopump, a titanium getter pump, or the like is used to minimize the amount of residual moisture.

The inert gas in which moisture and the like are removed by a purifier 124 located in the supply inlet is supplied at a dew point of −50° C. or lower, preferably −80° C. or lower. After the sealing chamber reaches the atmosphere pressure, supply of the inert gas is stopped. Note that the inert gas is circulated within the processing chamber by a circulator 123. A dew point meter 125 is located in the sealing chamber 115, and thus the dew point of the inert gas is always monitored to control the purity of the inert gas.

For bonding of the sealing plate, a pattern of a sealing member is drawn by a dispenser 118 located in a bonding chamber 117. When the substrate in which the pattern of the sealing member is drawn is bonded to the sealing plate in the sealing chamber 115, an inert gas such as nitrogen or argon with high purity is introduced thereinto and sufficiently substituted to obtain a state in which the concentration of oxygen in the processing chamber is minimized. A dry agent is provided inside the sealing member. When a ultraviolet curable resin is used as the sealing member, a UV irradiator 116 is used.

The temperature cycle processing and the power supply test for the substrate after sealing are performed in a thermal treatment chamber 119. Thus, processing for decreasing the dew point of the gas in the sealed space is performed. Therefore, the light emitting device having a sealing structure as shown in FIG. 3 can be completed.

Figure 5:
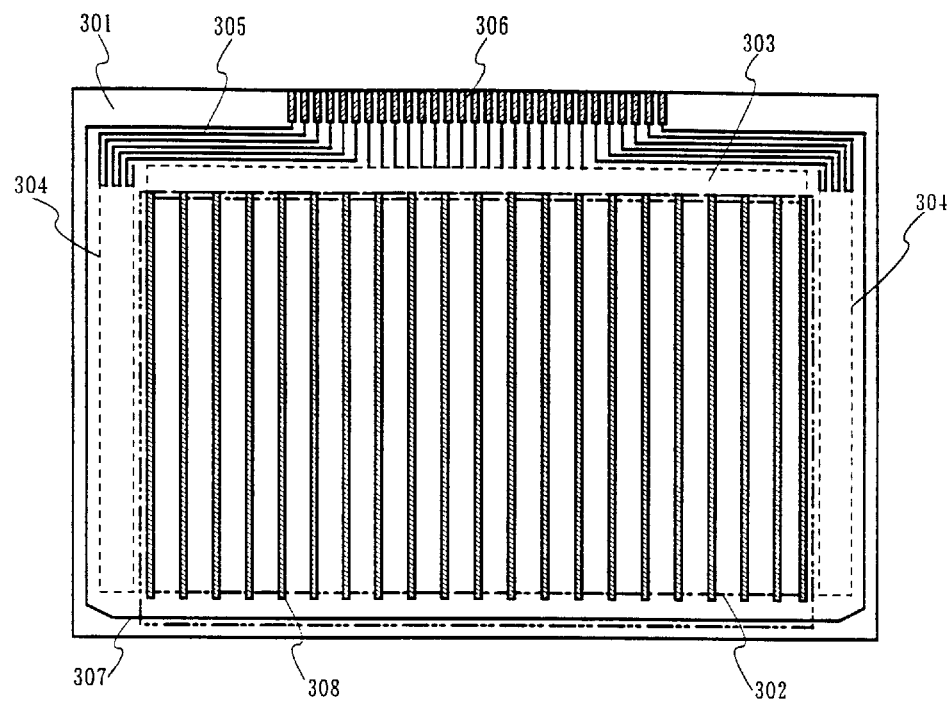
FIG. 5 is an explanatory view of a structure of a pixel portion in the light emitting device of the present invention.

FIG. 5 shows the appearance of the light emitting device and a state in which a pixel portion 302, a scan line side driver circuit 304, a signal line side driver circuit 303, and an input and output terminal 306 are formed on a substrate 301. The input and output terminal 306 are connected with the respective driver circuits through wirings 305. In the pixel portion 302, wirings 308 which also serve as isolation wall layers are formed in a direction to which a signal line for inputting an image signal is extended. These wirings 308 include a signal line and a power source line but the details are omitted here. A wiring 307 is used to connect the third electrode with an external input terminal and its connection method will be described in details through the following embodiments. If necessary, an IC chip in which a CPU, a memory, and the like are formed may be mounted in an element substrate by a COG (chip on glass) method.

Figure 6:
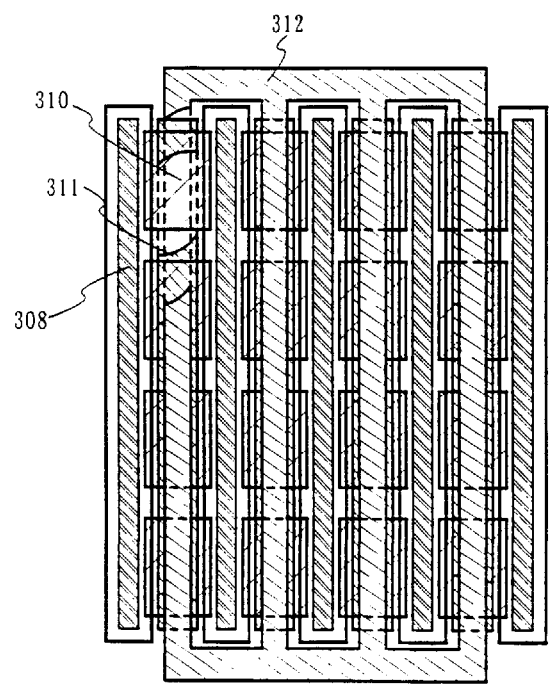
FIG. 6 is an explanatory view of one example of a manufacturing apparatus used for manufacturing the light emitting device of the present invention.

The organic light emitting element is formed between the wirings 308 and its structure is shown in FIG. 6. First electrodes 310 are separate electrodes and formed between the wirings 308. In the upper layer of the first electrodes, organic compound layers 311 are formed between the wirings 308 through a plurality of the first electrodes in a stripe shape in succession. A second electrode 312 is formed in the upper layer of the organic compound layers 311 between the wirings 308 in a stripe shape. The second electrode 312 is connected with a connection portion in a region which is not sandwiched by the wirings 308, that is, in an outside region of the pixel portion 302. The connection portion may be formed in one end portion or both end portions of the second electrode.

The organic light emitting element is defined by a region in which the first electrodes 310, the organic compound layers 311, and the second electrode 312 are overlapped. The first electrodes 312 are individually connected with active elements in an active matrix drive light emitting device. If the second electrode has a defect and thus a defect is caused in the pixel portion, there is a possibility that it is recognized as a line defect. However, as shown in FIG. 6, according to the structure such that both end portions of the second electrode are respectively connected with connection portions and the second electrode is used as a common electrode, a probability of causing such a line defect can be reduced.

As described above, in addition to processing such that a space for sealing the organic light emitting element is filled with a high purity inert gas, the thermal treatment before sealing and the temperature cycle processing of heating and cooling after sealing are performed for dehydration processing. Thus, residual moisture in the inert gas is kept at 50 ppm or lower, preferably, 1 ppm or lower and the deterioration of the organic light emitting element can be suppressed. Although the active matrix drive light emitting device is described here, a method of manufacturing the light emitting device according to the present invention can be applied to a passive drive light emitting device.

[Embodiment 1]

Figure 7A:
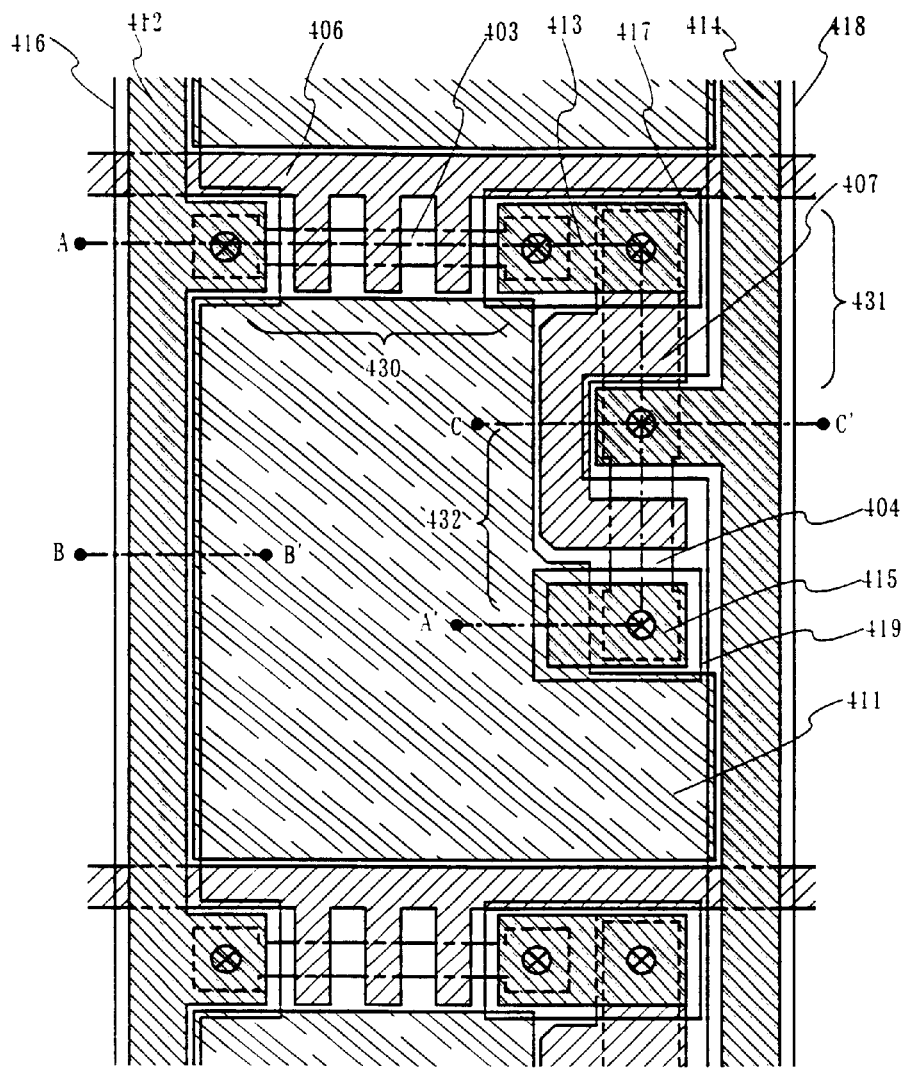
FIGS. 7A and 7B are top surface views for explaining a structure of one pixel in the pixel portion of the light emitting device of the present invention.

FIG. 7A shows one example of a structure of a pixel in an active matrix drive light emitting device. With respect to the pixel, a TFT is used as an active element and a switching TFT 430, a current control TFT 432, and an auxiliary capacitor 431 are provided. A wiring 412 is a signal line to which an image signal is inputted and a wiring 414 is a power source line for the organic light emitting element. Reference numeral 406 denotes a scan line which is connected with the gate electrode of the switching TFT 430. With respect to the switching TFT 430, a source region and a drain region are formed in a semiconductor film 403 and one region is connected with the wiring 412. The other region is connected with one electrode 407 of the auxiliary capacitor 431 through a connection electrode 413. The electrode 407 also serves as the gate electrode of the current control TFT 432. A source region and a drain region are also formed in the current control TFT 432 and one region is connected with the wiring 414. The other region is connected with an electrode 415 and the electrode 415 is connected with a pixel electrode 411. Although the organic compound layer and the cathode are formed on the pixel electrode 411, those are omitted here.

Figure 7B:
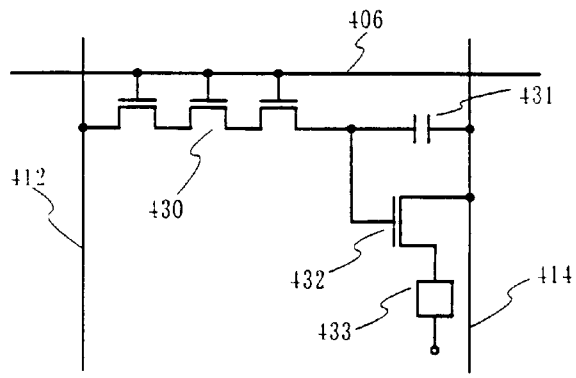

The switching TFT 430 is a multi gate structure in order to reduce an off current. With respect to the current control TFT 432, the channel width is extended in order to improve its current drive capacity. In the case of a drive current of 10 V or lower, even if the TFTs are formed in a single drain structure, these can be driven without causing any problem. In order to further reduce an off current or to prevent the deterioration due to a hot carrier, a low concentration drain (LDD) is suitably provided. An equivalent circuit of the pixel having such a structure is shown in FIG. 7B.

Figure 8A:
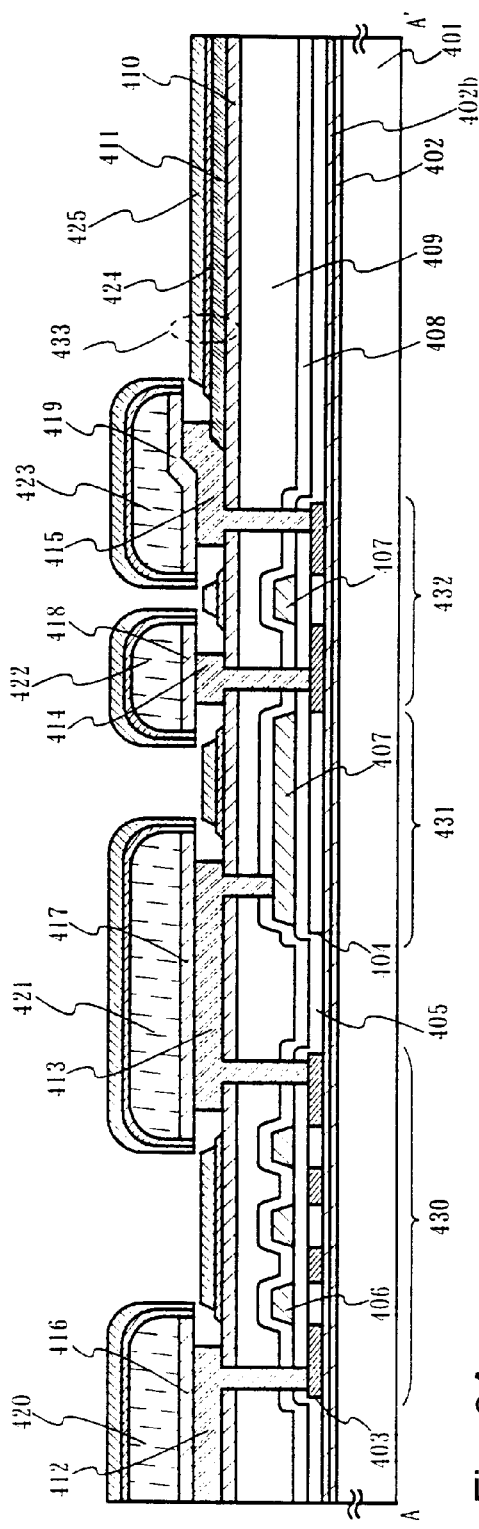
FIGS. 8A to 8C are cross sectional views for explaining a structure of the pixel in the pixel portion of the light emitting device of the present invention.
Figure 8C:
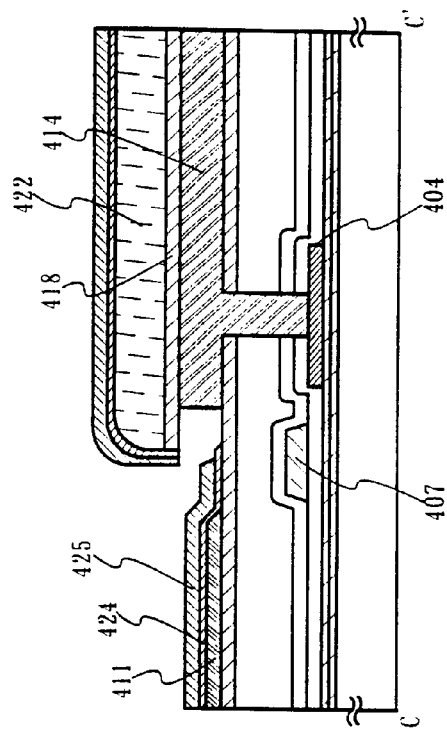
Figure 8B:
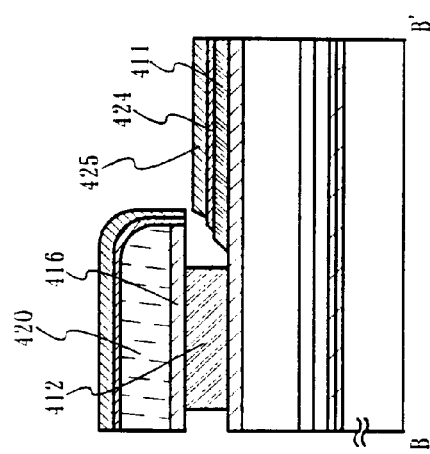

Cross sectional structures respectively corresponding to a line A–A', a line B–B', and a line C–C', which are indicated in FIG. 7A, are shown in FIGS. 8A to 8C.

FIG. 8A is a cross sectional structure corresponding to the line A–A' and shows a state in which a switching TFT 430, an auxiliary capacitor 431, and a current control TFT 432 are formed. As a substrate 401 which becomes a base for forming these elements, a glass substrate or an organic resin substrate is employed. An organic resin material is light in weight as compared with a glass material and effective for weight reduction of the light emitting device itself. As a material which can be applied in the case of manufacturing the light emitting device, an organic resin material such as polyimide, polyethylene terephthalate (PET), polyethylene naphthalate (PEN), Polyethersulfone (PES), or aramid can be used. Barium borosilicate glass or aluminoborosilicate glass, which is called no alkali glass, is desirably used as the glass substrate. The glass substrate having a thickness of 0.5 to 1.1 mm is used. However, it is necessary to thin the thickness for the purpose of weight reduction. For further weight reduction, a material having a small specific gravity of 2.37 g/cc is desirably used.

An insulating film 402 for the prevention of impurity diffusion from the substrate and stress control is formed on the substrate 401. This is made from an insulating film including silicon. For example, a silicon oxynitride film produced from $SiH_4$, $NH_3$, and $N_2O$ is formed at a thickness of 20 to 100 nm by using a plasma CVD method. With respect to the composition, the concentration of nitrogen is set to be 20 to 30 atoms %, the concentration of oxygen is set to be 20 to 30 atoms % and thus tensile stress is provided. Preferably, a silicon oxynitride film produced from $SiH_4$ and $N_2O$ is formed as an insulating film 402b in the upper layer of the insulating film 402. With respect to the composition of this film, the concentration of nitrogen is set to be 1 to 20 atoms % and the concentration of oxygen is set to be 55 to 65 atoms % and thus the concentration of nitrogen is decreased to reduce internal stress.

Semiconductor films 403 and 404 are made from a silicon film having a crystalline structure. A typical example is a semiconductor film formed by laser light irradiation or thermal treatment to an amorphous silicon film manufactured using a plasma CVD method. Its thickness is set to be 20 to 60 nm. In the upper layer thereof, a second insulating film 405 as a gate insulating film and gate electrodes 406 and 407 are formed. The gate electrode 407 is connected with one electrode of the auxiliary capacitor 431.

In the upper layer of the gate electrodes, a third insulating layer 408 made of silicon nitride produced from $SiH_4$, $NH_3$, and $N_2$ or silicon oxynitride produced from $SiH_4$, $NH_3$, and $N_2O$ is formed and used as a protective film. Further, a fourth insulating film 409 made of an organic resin material such as polyimide or acrylic is formed as a leveling film.

A fifth insulating film 410 made of an inorganic insulating material such as silicon nitride is formed on the fourth insulating film made of the organic resin material. The organic resin material has hygroscopicity, a characteristic of occluding moisture. If the moisture is again emitted, oxygen is supplied to an organic compound and thus this causes the deterioration of the organic light emitting element. Therefore, in order to prevent the occlusion of moisture and the reemission thereof, the fifth insulating film 410 made of silicon nitride produced from $SiH_4$, $NH_3$, and $N_2$ or silicon oxynitride produced from $SiH_4$, $NH_3$, and $N_2O$ is formed on the fourth insulating film 409. Alternatively, the fourth insulating film 409 is omitted and only one layer of the fifth insulating film 410 can be used as a substitute.

After that, contact holes which reach the source region and the drain region in the respective semiconductor films are formed and a transparent conductive film made of ITO (indium tin oxide), zinc oxide, or the like is formed at a thickness of 110 nm by a sputtering method, and then etched at a predetermined shape (shape as shown in FIG. 7A) to form an anode 411 as one electrode of an organic light emitting element 433.

The wirings 412 and 414 and the connection electrodes 413 and 415 are made to be a laminate structure of titanium and aluminum and formed at a total thickness of 300 to 500 nm to form contacts with the semiconductor films. The connection electrode 415 is formed so as to partially overlap it with the anode 411.

Insulating films 416 to 419 formed on the wirings or the connection electrodes are made of silicon nitride or the like. End portions of the insulating films are formed such that those are located outside the wirings or the connection electrodes. With respect to such a structure, a layer of a conductive film for forming the wirings and an insulating film are laminated and etched in accordance with a pattern of the resists 420 to 423. After that, when only the conductive film is etched leaving the resist pattern, canopies as shown in FIG. 8A can be formed. Thus, the insulating films 416 to 419 are not necessarily limited to an insulating film. If an etching selection ratio to the conductive film for forming the wirings is obtained, another material can be also applied thereto.

An organic compound layer 424 and a cathode 425 are formed by an evaporation method. Thus, since the canopies formed here becomes masks, the organic compound layer 424 and the cathode 425 can be formed on the anode 411 in a self alignment. The resists 420 to 423 may be left on the insulating films 416 to 419 or removed.

Since Wet processing (processing such as etching with a chemical solution or washing) cannot be performed for the organic compound layer 424 and the cathode 425, it is required that an isolation wall layer made of an insulating material is provided corresponding to the anode 411 to insulation-isolate adjacent elements. However, when the pixel structure of the present invention is used, the wirings and the insulating films located thereon can be substituted for the function of the isolation wall layer.

Thus, the organic light emitting element 433 is composed of the anode 411 made of a transparent conductive material such as ITO, the organic compound layer 424 including a hole injection layer, a hole transport layer, a light emitting layer, and the like, and the cathode 425 made of a material of alkali metal, alkali earth metal, or the like, such as MgAg or LiF.

FIG. 8B shows a cross sectional structure corresponding to the line B–B' in FIG. 7 and FIG. 8C shows a cross sectional structure corresponding to the line C–C'.

Figure 10A:
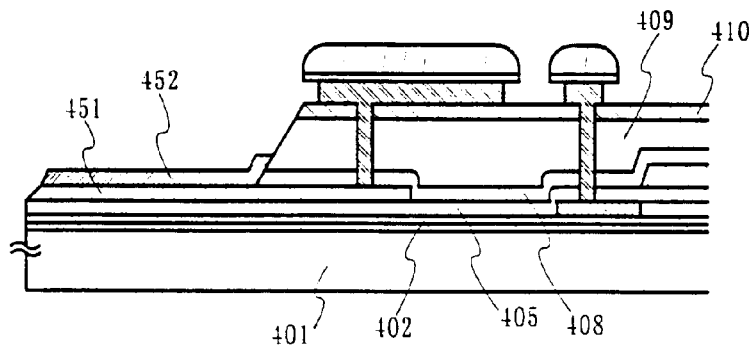
FIGS. 10A and 10B are cross sectional views indicating a terminal portion in the light emitting device of the present invention and a connection between a cathode and a wiring.

In an input terminal portion, as shown in FIG. 10A, an input terminal 451 is made of the same material as the gate electrode. The third insulating film 408, the fourth insulating film 409, and the fifth insulating film 410, which are formed in the upper layer of the input terminal, are removed simultaneous to etching of contact holes and thus the surface can be exposed. When a transparent conductive film 452 is laminated in the input terminal 451, the connection to an FPC can be made.

Figure 10B:
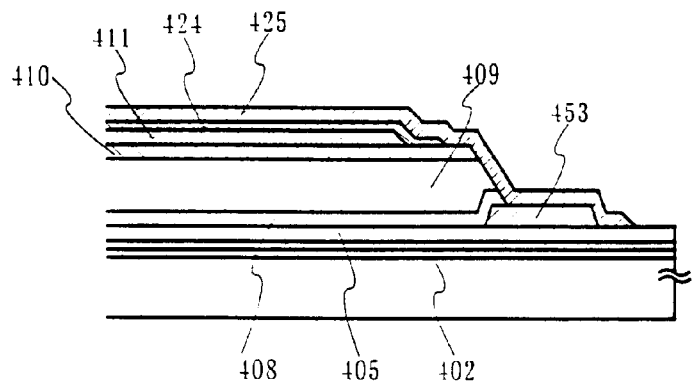

Since the cathode of the organic light emitting element 433 becomes a common electrode, the connection is made outside the pixel portion. The cathode is connected with a wiring of an external input terminal such that a potential can be controlled from the outside. FIG. 10B shows one example of such a connection structure. A wiring 453 is made from the same layer of the gate electrode. The third insulating film 408, the fourth insulating film 409, and the fifth insulating film 410, which are formed in the upper layer of the wiring 453, are removed simultaneous to etching of contact holes to expose the surface. Although the organic compound layer 424 is formed by an evaporation method, it is formed on the entire surface of the substrate if further processing is not performed. Thus, the organic compound layer 424 is formed corresponding to the region of the pixel portion using a shadow mask such as a metal mask or a ceramic mask. Although the cathode 425 is formed similarly, a size of the mask is changed such that the cathode 425 is extended to a region outside the pixel portion. The structure as shown in FIG. 10B can be obtained by such processing.

Thus, the organic light emitting element 433 is formed on the anode and there is no case where the organic light emitting element is influenced by stress from members formed in surroundings. Thus, the deterioration of the organic light emitting element by thermal stress and the like can be prevented. After that, the organic light emitting element is sealed by the processes described using FIGS. 1A to 1C. Therefore, the light emitting device having high reliability can be manufactured.

[Embodiment 2]

Figure 9:
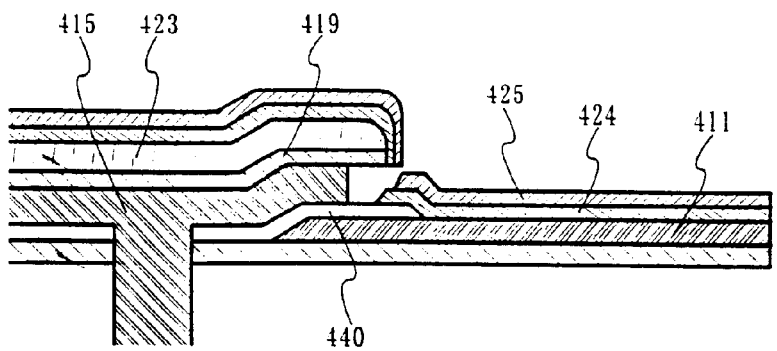
FIG. 9 is a cross sectional view for explaining one embodiment of an organic light emitting element of the present invention.

Another structure of the organic light emitting element described using FIGS. 8A to 8C in Embodiment 1 will be described with reference to FIG. 9. A seventh insulating film is formed after the formation of the anode 411. This insulating film is made of silicon oxide or silicon nitride. After that, the seventh insulating film located on the anode 411 is removed by etching. At this time, as shown in FIG. 9, end portions of the anode 411 is overlapped with the seventh insulating film. Thus, a pattern-formed seventh insulating film 440 is obtained.

Later processes are performed as in the case of Embodiment 1 to form the connection electrode 415, the insulating film 419, and the like. The organic compound layer 424 and the cathode 425 are formed as shown in FIG. 9. When the seventh insulating film 440 is provided, it can be prevented that the cathode 425 is in contact with the anode 411 in the end portions and a short circuit is caused.

Of course, even in the case of the pixel structure indicated in this embodiment, the deterioration of the organic light emitting element due to thermal stress can be prevented. Also, the organic light emitting element is sealed by the processes described using FIGS. 1A to 1C and thus the light emitting device having high reliability can be manufactured.

[Embodiment 3]

One example of a top gate TFI is described in Embodiment 1. However, even when a bottom gate TFT or an inverse stagger TFT is used, the switching TFT 430 and the current control TFT 432 can be formed as in the case of Embodiment 1. In addition, the light emitting device can be manufactured as in the case of Embodiment 1.

[Embodiment 4]

With respect to the organic light emitting element applied in the present invention, there is no case where its structure is limited. The organic light emitting element is composed of an anode made from a translucent conductive film, a cathode including alkali metal, and a layer made of an organic compound, which is interposed therebetween. The layer made of an organic compound composed of a single layer or plural layers. The respective layers are separately called a hole injection layer, a hole transport layer, a light emitting layer, an electron transport layer, an electron injection layer, and the like in accordance with their purposes and functions. These layers can be formed by a small molecular system organic compound material, a polymer system organic compound material, or a suitable combination of both materials.

For the hole injection layer and the hole transport layer, an organic compound material having superior hole transport characteristic is selected. Typically, a material of phthalocyanine system or aromatic amine system is used. Also, a metal complex having superior electron transport characteristic or the like is used for the electron injection layer.

Figure 11A:
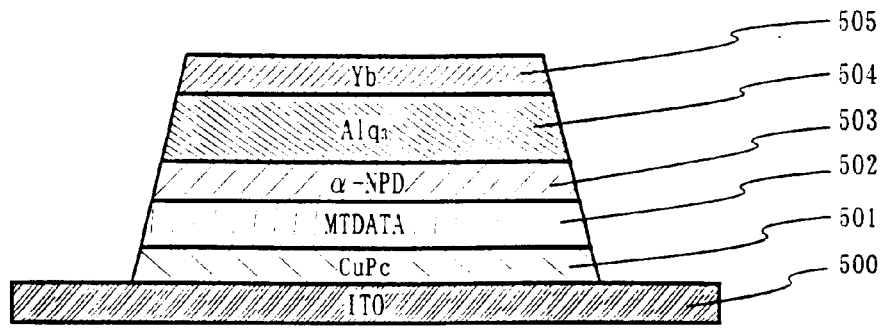
FIGS. 11A to 11C are explanatory views of the structure of the organic light emitting element.
Figure 11B:
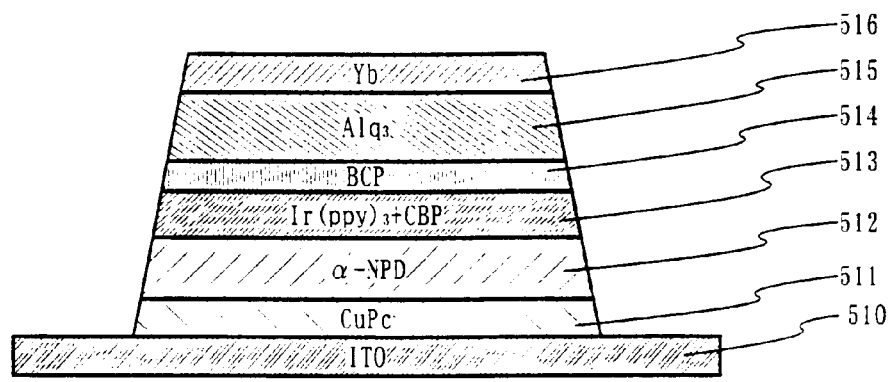
Figure 11C:
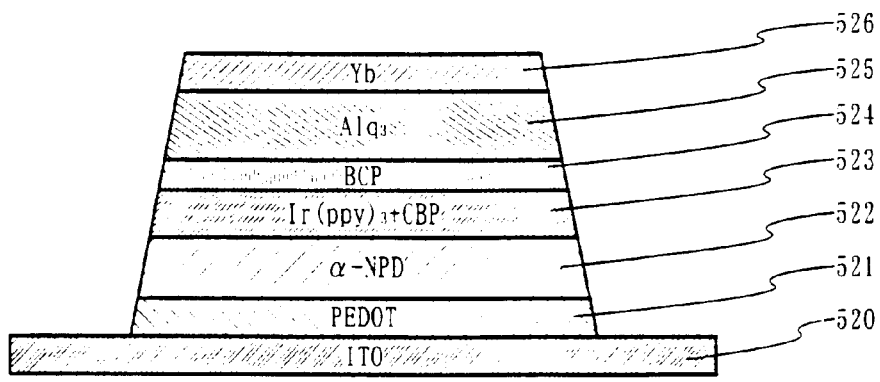

FIGS. 11A to 11C show examples of a structure of the organic light emitting element. FIG. 11A shows one example of the organic light emitting element using the small molecular organic compound material. On an insulating film 508 made of silicon nitride or silicon oxynitride, an anode 500 made of indium tin oxide (ITO), a hole injection layer 501 made of copper phthalocyanine (CuPc), hole transport layers 502 and 503 made of MTDATA and α-NPD as aromatic amine system materials, an electron injection layer and light emitting layer 504 made of tris-8-quinolinolato aluminum complex ($Alq_3$), and a cathode 505 made of ytterbium (Yb) are laminated. With respect to $Alq_3$, light emission from a singlet excitation state (fluorescence) is allowed. A barrier layer is made of a photosensitive organic resin and has an inverse taper type such that one end of its bottom portion is in contact with the anode and the top portion is located inside the anode. After the cathode 505 is formed, a protective insulating film is formed thereon and then sealed so as not to directly expose the organic compound layer and the cathode to an atmosphere.

In order to increase the intensity, light emission from a triplet excitation state (phosphorescence) is preferably utilized. FIG. 11B shows one example of such an element structure. The structure is as follows. A light emitting layer 513 made of CBP+Ir(ppy)$_3$ as a carbazole system material is formed on or over an anode 510 made of ITO, a hole injection layer 511 made of CuPc as a phthalocyanine system material, a hole transport layer 512 made of α-NPD as an aromatic amine system material. Further, a hole blocking layer 514 made of bathocuproine (BCP) is formed and an electron injection layer 515 made of $Alq_3$ is formed.

The above two structures are examples using the small molecular system organic compound. Also, the organic light emitting element using a combination of the polymer system organic compound and the small molecular system organic compound can be realized. FIG. 11C shows one example thereof. A hole injection layer 521 is made of a polythiophene derivative (PEDOT) as the polymer system organic compound, a hole transport layer 522 is made of α-NPD, a light emitting layer 523 is made of CBP+Ir(ppy)$_3$, a hole blocking layer 524 is made of BCP, and an electron injection layer 525 is made of Alq$_3$. When the hole injection is made of PEDOT, hole injection characteristic is improved and thus light emission efficiency can be improved.

Tris-(2-phenylpyridine)iridium (hereinafter referred to as Ir(ppy)$_3$) and 4,4'-N,N'-dicarbazole-biphenyl (hereinafter referred to as CBP) for the light emitting layer are organic compound layers capable of producing the light emission from the triplet excitation state (phosphorescence). With respect to a triplet compound, there are organic compounds described in the following papers as typical organic compounds.

(1) T. Tsutsui, C. Adachi, S. Saito, Photochemical Processes in Organized Molecular Systems, ed. K. Honda (Elsevier Sci. Pub., Tokyo, 1991) p.437.

(2) M. A. Baldo, D. F. O'Brien, Y. You, A. Shoustikov, S. Sibley, M. E. Thompson, S. R. Forrest. Nature 395 (1998) p. 151. Organic compounds indicated by the following structural formula (III) are described in this paper.

(3) M. A. Baldo, S. Lamansky, P. E. Burrrows, M. E. Thompson, S. R. Forrest, Appl. Phys. Lett., 75 (1999) p.4.

(4) T. Tsutsui, M.-J. Yang, M. Yahiro, K. Nakamura, T. Watanabe, T. Tsuji, Y. Fukuda, T. Wakimoto, S. Mayaguchi, Jpn. Appl. Phys., 38 (12B) (1999) L1502.

It is considered that not only the light emitting materials described in the above paper but also a light emitting material indicated by the following molecular formula (IV) (concretely a metal complex or an organic compound) can be used.

Chem. 3

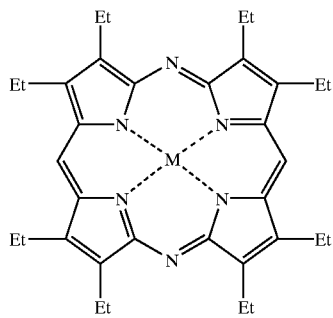

(in this formula, Et is style group, M represents element of group 8–10 of the periodic table)

Chem. 4

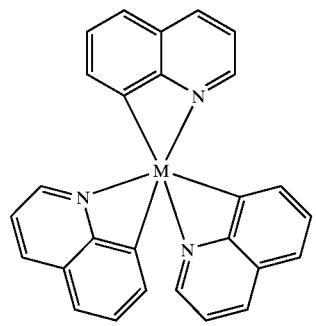

(in this formula, M represents element of group 8–10 of the periodic table)

In the above molecular formula, M denotes an element belonging to groups 8 to 10 of the periodic table. According to the above paper, platinum or iridium is used. The present invention considers that nickel, cobalt, or palladium is a low cost than platinum and iridium and thus these element are preferable to reduce a manufacturing cost of an EL display device. In particular, it is considered that nickel is easy to form a complex and thus high productivity is obtained. In any case, high light emission efficiency is obtained in the light emission from the triplet excitation state (phosphorescence) as compared with the light emitting from the singlet excitation state (fluorescence). Therefore, even when the same light emission intensity is obtained, a drive voltage (voltage required for light emission by the organic compound element) can be reduced.

CuPc of phthalocyanine system, α-NPD of aromatic amine system, MTDATA, CBP of carbazole system, and the like are organic compounds not including oxygen as a molecule thereof. When oxygen or moisture is mixed into such an organic compound, a change in a bonding state is caused to deteriorate the hole transport characteristic and the light emission characteristic. However, when sealing is performed by the manufacturing method described using FIGS. 1A to 1C in the formation of such an organic compound layer, such deterioration can be prevented. Although the laminate structure of the organic compound layer is described here, when light emitting layers for emitting lights of red, blue, and green are used, the light emitting device having superior color emission can be also obtained.

[Embodiment 5]

A light-emitting device of the present invention has superior visibility in bright locations and moreover viewing angle is wide. Accordingly, it can be applied to various electronic apparatuses. The following can be given as examples of such electronic apparatuses: a video camera; a digital camera; a goggle type display (head mounted display); a car navigation system; an audio reproducing device (such as a car audio system, an audio compo system); a laptop personal computer; a game equipment; a portable information terminal (such as a mobile computer, a mobile telephone, a mobile game equipment or an electronic book); and an image playback device provided with a recording medium. In particular, because portable information terminals are often viewed from a diagonal direction, the wideness of the field of vision is regarded as very important. Thus, it is preferable that the light-emitting device is employed. Examples of these electronic apparatuses are shown in FIGS. 12 and 13.

Figure 12A:
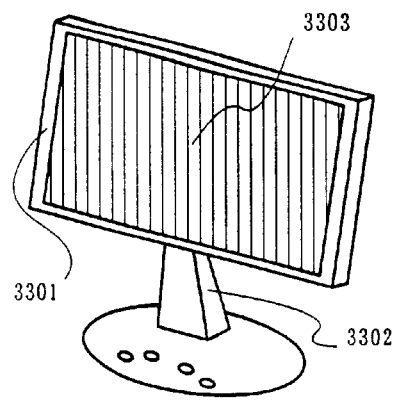
FIGS. 12A to 12F are explanatory views of applications of the light emitting device of the present invention.

FIG. 12A illustrates a monitor of a desktop personal computer and so forth, which includes a frame 3301, a support table 3302, a display portion 3303, or the like. The light-emitting device of the present invention can be used as the display portion 3303. The monitor needs no back light and can be realized to be thinner and lighter than the liquid crystal display device.

Figure 12B:
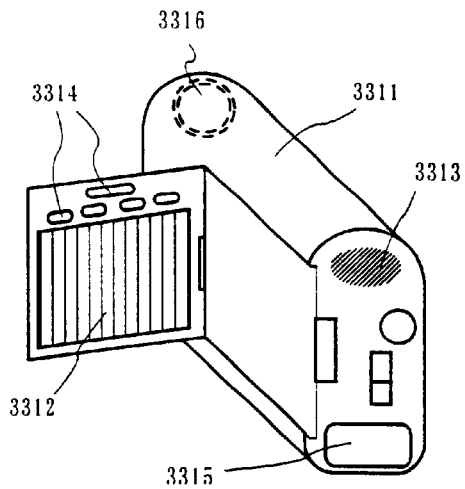

FIG. 12B illustrates a video camera which includes a main body 3311, a display portion 3312, an audio input portion 3313, operation switches 3314, a battery 3315, an image receiving portion 3316, or the like. The light-emitting device of the present can be used as the display portion 3312.

Figure 12C:
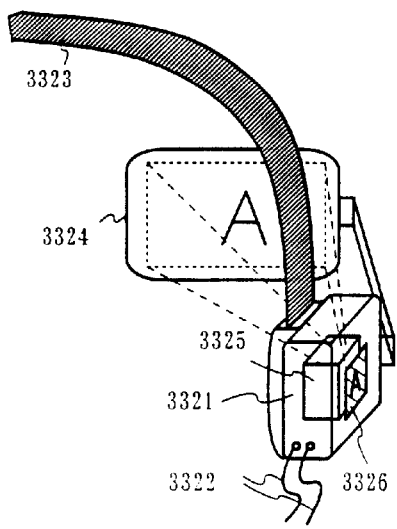

FIG. 12C illustrates a portion (the right-half piece) of a head-mounted EL display which includes a main body 3321, signal cables 3322, a head mount band 3323, a screen portion 3324, an optical system 3325, a display 3326, or the like. The light-emitting device of the present invention can be used as the display portion 3326.

Figure 12D:
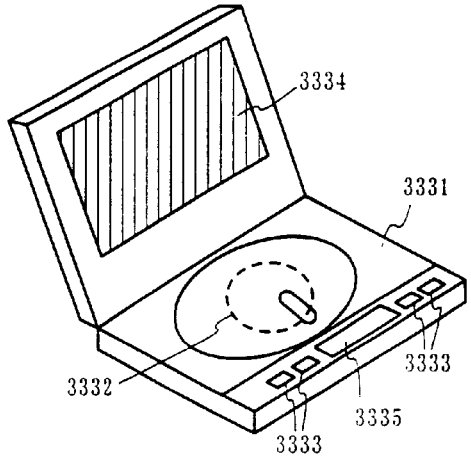

FIG. 12D illustrates an image reproduction apparatus which includes a recording medium (more specifically, a DVD reproduction apparatus), which includes a main body 3331, a recording medium (a DVD or the like) 3332, operation switches 3333, a display portion (a) 3334, another display portion (b) 3335, or the like. The display portion (a) 3334 is used mainly for displaying image information, while the display portion (b) 3335 is used mainly for displaying character information. The light-emitting device of the present invention can be used as these display portions (a) 3334 and (b) 3335. The image reproduction apparatus including a recording medium further includes a domestic game equipment or the like.

Figure 12E:
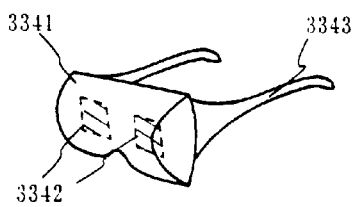

FIG. 12E illustrates a goggle type display (head-mounted display) which includes a main body 3341, a display portion 3342, an arm portion 3343. The light-emitting device of the present invention can be used as the display portion 3342.

Figure 12F:
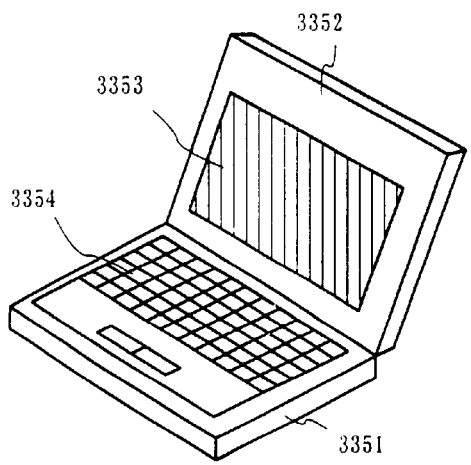

FIG. 12F illustrates a laptop personal computer which includes a main body 3351, a frame 3352, a display portion 3353, a key board 3354, or the like. The light-emitting device of the present invention can be used as the display portion 3353.

The above mentioned electronic apparatuses are more likely to be used for display information distributed through a telecommunication path such as Internet, a CATV (cable television system), and in particular likely to display moving picture information. The light-emitting device of the present invention is suitable for displaying moving pictures since the organic material can exhibit high response speed.

Further, since a light emitting portion of the light-emitting device consumes power, it is desirable to display information in such a manner that the light emitting portion therein becomes as small as possible. Accordingly, when the light-emitting device is applied to a display portion which mainly displays character information, e.g., a display portion of a portable information terminal, and more particular, a portable telephone or an audio reproducing device, it is desirable to drive the light-emitting device so that the character information is formed by a light-emitting portion while a non-emission portion corresponds to the background.

Figure 13A:
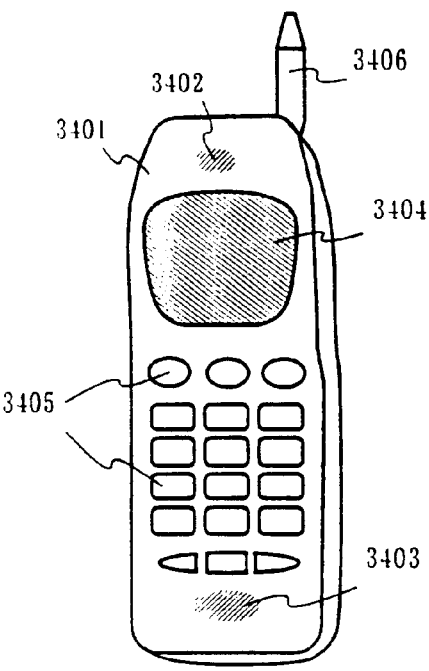
FIGS. 13A to 13C are explanatory views of applications of the light emitting device of the present invention.

FIG. 13A illustrates a portable telephone which includes a main body 3401, an audio output portion 3402, an audio input portion 3403, a display portion 3404, operation switches 3405, and an antenna 3406. The light-emitting device of the present invention can be used as the display portion 3404. Note that the display portion 3404 can reduce power consumption of the portable telephone by displaying white-colored characters on a black-colored background.

Figure 13B:
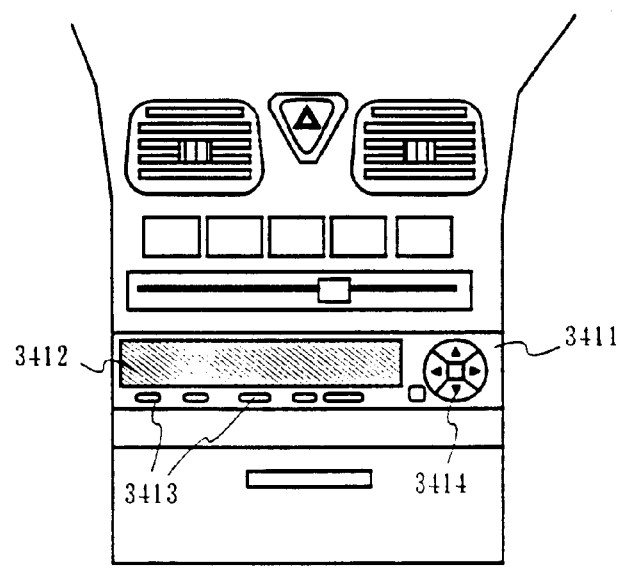

Further, FIG. 13B illustrates a sound reproduction device, specifically, a car audio equipment, which includes a main body 3411, a display portion 3412, and operation switches 3413 and 3414. The light-emitting device of the present invention can be used as the display portion 3412. Although the car audio equipment of the mount type is shown in the present embodiment, the present invention is also applicable to a portable type or domestic sound reproducing device. The display portion 3414 can reduce power consumption by displaying white-colored characters on a black-colored background, which is particularly advantageous for the portable type sound reproduction device.

Figure 13C:
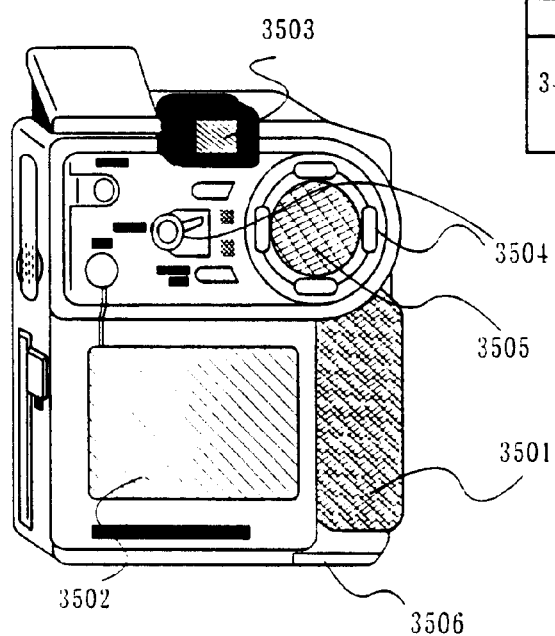

FIG. 13C illustrates a digital camera which includes a main body 3501, a display portion (A) 3502, a view finder portion 3503, operation switches 3504, a display portion (B) 3505, and a battery 3506. The light-emitting device of the present invention can be used for the display portions (A) 3502 and (B) 3505. Further, in a case where the display portion (B) 3505 is used for an operation panel, the power consumption can be reduced by displaying white-colored characters on a black-colored background.

In the case of the portable type electronic apparatuses shown in this embodiment, the sensor portion is provided to perceive the external light and the function to lower the brightness of display when it is used in the dark area as a method to lower the power consumption. As set forth above, the present invention can be applied variously to a wide range of electronic apparatuses in all fields. The electronic apparatuses in this embodiment may use any one of configurations shown in Embodiments 1 to 4.

According to the present invention, in addition to processing such that a space for sealing the organic light emitting element is filled with a high purity inert gas, the thermal treatment before sealing and the temperature cycle processing of heating and cooling after sealing are performed for dehydration processing. Thus, residual moisture in the inert gas is kept at 50 ppm or lower, preferably, 1 ppm or lower and the deterioration of the organic light emitting element can be suppressed.

Also, the structure such that the organic light emitting layer is formed on the anode and not in contact with members formed in surroundings is used. Thus, the deterioration of the organic light emitting element by thermal stress can be prevented.

As described above, according to the present invention, two aspects, an impurity factor and a structural factor are considered as the deterioration causes of the organic light emitting device and suitable measures are provided to offset the respective factors. Thus, the reliability of the light emitting device can be improved.

What is claimed is:

1. A light emitting device comprising:
a first electrode on a first insulating film;
a second electrode in contact with the first electrode and on the first insulating film;
a second insulating film formed on the second electrode;
an organic compound layer located on the first electrode; and
a third electrode located on the organic compound layer,
wherein end portions of the second insulating film are provided outside end portions of the second electrode and are not overlapped with end portions of the organic compound layer.

2. A light emitting device according to claim 1, wherein the light emitting device is at least one device selected from the group consisting of: a monitor of a desktop personal computer, a video camera, a head-mounted EL display, a DVD, a goggle type display, a laptop personal computer, a portable telephone, a car audio equipment and a digital camera.

3. A light emitting device comprising:
a first electrode on a first insulating film;
a second electrode in contact with end portions of the first electrode and on the first insulating film;
a second insulating film on the second electrode and having end portions located outside the second electrode;
an organic compound layer located on the first electrode; and
a third electrode located on the organic compound layer,
wherein end portions of the organic compound layer are not overlapped with end portions of the second insulating film.

4. A light emitting device according to claim 3, wherein the light emitting device is at least one device selected from the group consisting of: a monitor of a desktop personal computer, a video camera, a head-mounted EL display, a DVD, a goggle type display, a laptop personal computer, a portable telephone, a car audio equipment and a digital camera.

5. A light emitting device comprising:
- a first wiring, a second wiring and a first electrode on a first insulating film, the first electrode provided between the first wiring and the second wiring;
- a second electrode connected with the first electrode and on the first insulating film;
- an organic compound layer located on the first electrode; and
- a third electrode located on the organic compound layer,
- wherein the organic compound layer and the third electrode are provided inside the first wiring and the second wiring.

6. A light emitting device according to claim 5, wherein the light emitting device is at least one device selected from the group consisting of: a monitor of a desktop personal computer, a video camera, a head-mounted EL display, a DVD, a goggle type display, a laptop personal computer, a portable telephone, a car audio equipment and a digital camera.

7. A light emitting device comprising:
- a first wiring on a first insulating film;
- a second insulating film provided on the first wiring;
- a second wiring on the first insulating film;
- a third insulating film provided on the second wiring;
- a first electrode provided between the first wiring and the second wiring and on the first insulating film;
- an organic compound layer located on the first electrode; and
- a third electrode located on the organic compound layer,
- wherein the first wiring is in contact with the first electrode, end portions of the second insulating film are provided outside the first wiring, end portions of the third insulating film are provided outside the second wiring, and the organic compound layer and the third electrode are provided inside the first wiring and the second wiring.

8. A light emitting device according to claim 7, wherein the light emitting device is at least one device selected from the group consisting of: a monitor of a desktop personal computer, a video camera, a head-mounted EL display, a DVD, a goggle type display, a laptop personal computer, a portable telephone, a car audio equipment and a digital camera.

9. A light emitting device in which a pixel portion is formed on a first insulating film, comprising:
- a first wiring, a second wiring and a first electrode on a first insulating film, the first electrode provided between the first wiring and the second wiring;
- a first organic compound layer provided on the first electrode;
- a second electrode provided on the first organic compound layer;
- a third wiring and a third electrode on the first insulating film, the third electrode provided between the second wiring and the third wiring;
- a second organic compound layer provided on the third electrode; and
- a fourth electrode provided on the second organic compound layer,
- wherein the second electrode is connected with the fourth electrode in an outer edge portion of the pixel portion.

10. A light emitting device according to claim 9, wherein the light emitting device is at least one device selected from the group consisting of: a monitor of a desktop personal computer, a video camera, a head-mounted EL display, a DVD, a goggle type display, a laptop personal computer, a portable telephone, a car audio equipment and a digital camera.

11. A light emitting device having a pixel portion on a first insulating film, comprising:
- a first wiring, a second wiring and a first electrode on a first insulating film, the first electrode provided between the first wiring and the second wiring;
- a first organic compound layer provided on the first electrode;
- a second electrode provided on the first organic compound layer;
- a second insulating film and a third insulating film provided on the first wiring and the second wiring, respectively, with end portions of the second insulating film and the third insulating film extending beyond side portions of the first wiring and the second wiring;
- a third wiring and a third electrode on the first insulating film, the third electrode provided between the second wiring and the third wiring;
- a second organic compound layer provided on the third electrode;
- a fourth electrode provided on the second organic compound layer; and
- a fourth insulating film provided on the third wiring with end portions of the third insulating film extending beyond side portions of the third wiring,
- wherein the first organic compound layer does not overlap with the end portions of the second insulating film and the third insulating film, and the second electrode is connected with the fourth electrode in an outer edge portion of the pixel portion.

12. A light emitting device according to claim 11, wherein the light emitting device is at least one device selected from the group consisting of: a monitor of a desktop personal computer, a video camera, a head-mounted EL display, a DVD, a goggle type display, a laptop personal computer, a portable telephone, a car audio equipment and a digital camera.

13. A light emitting device having a pixel portion on a first insulating film, the pixel portion comprising:
- a first wiring, a second wiring and a first electrode, the first electrode provided between the first wiring and the second wiring;
- a first organic compound layer provided on the first electrode;
- a second electrode provided on the first organic compound layer;
- a third wiring and a third electrode on the first insulating film, the third electrode provided between the second wiring and the third wiring;
- a second organic compound layer provided on the third electrode; and
- a fourth electrode provided on the second organic compound layer,
- wherein the pixel portion is provided in a closed space produced by a sealing member and a concentration of oxygen and moisture in the closed space is 2 ppm or lower.

14. A light emitting device according to claim 13, wherein the light emitting device is at least one device selected from the group consisting of: a monitor of a desktop personal computer, a video camera, a head-mounted EL display, a DVD, a goggle type display, a laptop personal computer, a portable telephone, a car audio equipment and a digital camera.

15. A light emitting device comprising:
   a first electrode on a first insulating film;
   a second electrode electrically connected with the first electrode and on the first insulating film, wherein the second electrode has one side edge in contact with the first electrode;
   a second insulating film formed on the second electrode, wherein the second insulating film extends beyond at least one side edge of the second electrode;
   a light emitting film comprising an organic material formed on the second electrode; and
   a third electrode located on the light emitting film,
   wherein the light emitting layer is distant from the second electrode.

16. A light emitting device having a pixel portion on a first insulating film, the pixel portion comprising:
   a first wiring, a second wiring and a first electrode on a first insulating film, the first electrode provided between the first wiring and the second wiring;
   a first organic compound layer provided on the first electrode;
   a second electrode provided on the first organic compound layer;
   a third wiring and a third electrode on the first insulating film, the third electrode provided between the second wiring and the third wiring;
   a second organic compound layer provided on the third electrode; and
   a fourth electrode provided on the second organic compound layer,
   wherein the pixel portion is provided in a closed space produced by a sealing member, the closed space is filled with at least one gas selected from the group consisting of nitrogen, helium, argon, krypton and neon, and a concentration of oxygen and moisture in the closed space is 2 ppm or lower.

17. A light emitting device according to claim 16, wherein the light emitting device is at least one device selected from the group consisting of: a monitor of a desktop personal computer, a video camera, a head-mounted EL display, a DVD, a goggle type display, a laptop personal computer, a portable telephone, a car audio equipment and a digital camera.

* * * * *